United States Patent
Lei et al.

(10) Patent No.: US 10,206,314 B2
(45) Date of Patent: Feb. 12, 2019

(54) POWER MODULE ASSEMBLY AND MANIFOLD

(71) Applicant: Ford Global Technologies, LLC, Dearborn, MI (US)

(72) Inventors: Guangyin Lei, Dearborn Heights, MI (US); Michael W. Degner, Novi, MI (US); Tienli Wang, Troy, MI (US); Edward Chan-Jiun Jih, Troy, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/810,612

(22) Filed: Nov. 13, 2017

(65) Prior Publication Data

US 2018/0070481 A1   Mar. 8, 2018

Related U.S. Application Data

(62) Division of application No. 14/687,579, filed on Apr. 15, 2015, now Pat. No. 9,848,519.

(51) Int. Cl.
| | |
|---|---|
| *H05K 7/20* | (2006.01) |
| *F28F 9/02* | (2006.01) |
| *F28F 9/00* | (2006.01) |
| *H01H 9/52* | (2006.01) |
| *H01L 23/473* | (2006.01) |
| *F28D 9/00* | (2006.01) |

(52) U.S. Cl.
CPC ....... *H05K 7/20927* (2013.01); *F28D 9/0043* (2013.01); *F28F 9/0246* (2013.01); *H01H 9/52* (2013.01); *H01L 23/473* (2013.01)

(58) Field of Classification Search
CPC ....... H05K 7/20927; H05K 7/20272–7/20218; H01H 9/52; H01L 23/473; H02K 9/19; B60L 11/1803; B60L 11/1851
USPC .......... 361/699, 702; 165/80.4–80.5, 104.33; 257/714; 174/15.1, 547
See application file for complete search history.

(56) References Cited

U.S. PATENT DOCUMENTS

| | | |
|---|---|---|
| 6,404,628 B1 | 6/2002 | Nagashima et al. |
| 6,661,659 B2 | 12/2003 | Tamba et al. |
| 7,564,129 B2 | 7/2009 | Nakanishi et al. |

(Continued)

FOREIGN PATENT DOCUMENTS

EP   2432106 A1   3/2012

*Primary Examiner* — Zachary Pape
(74) *Attorney, Agent, or Firm* — David B. Kelley; Brooks Kushman P.C.

(57) ABSTRACT

A vehicle power module assembly including a stacked array of module frames, a manifold, and a pair of endplates is provided. The stacked array of module frames may each define a passthrough in registration with other of the passthroughs to define a manifold cavity, a power stage cavity, and a plurality of outlets open to the respective passthroughs and oriented relative to the power stage cavities to deliver coolant therebetween. The manifold may be disposed within the manifold cavity and defines a manifold inlet open to an inlet chamber and manifold ports for alignment with the plurality of outlets. One of the endplates may define an inlet open to the manifold inlet and another one of the endplates may define an outlet open to a manifold outlet. The inlets, outlets, and ports are arranged with one another to provide a coolant path between the endplate inlet and endplate outlet.

3 Claims, 9 Drawing Sheets

(56) References Cited

U.S. PATENT DOCUMENTS

| | | |
|---|---|---|
| 7,952,875 B2 | 5/2011 | Woody et al. |
| 8,125,781 B2 | 2/2012 | Mamitsu et al. |
| 8,169,780 B2 | 5/2012 | Yoshino et al. |
| 8,203,839 B2 | 6/2012 | Dede |
| 8,342,276 B2 | 1/2013 | Murakami |
| 8,391,008 B2 | 3/2013 | Dede |
| 8,393,384 B2 * | 3/2013 | Velte .................. F28D 9/005 165/167 |
| 8,537,551 B2 * | 9/2013 | Ide .................. H01L 23/473 257/706 |
| 8,848,370 B2 | 9/2014 | Shin et al. |
| 9,538,691 B2 | 1/2017 | Kikuchi et al. |
| 2011/0120678 A1 * | 5/2011 | Palm .................. F28D 9/0075 165/109.1 |
| 2013/0044434 A1 | 2/2013 | Sharaf et al. |
| 2013/0301328 A1 | 11/2013 | Ito |
| 2014/0178736 A1 | 6/2014 | Gandhi et al. |
| 2016/0303995 A1 | 10/2016 | Lei et al. |
| 2016/0308480 A1 | 10/2016 | Wang et al. |
| 2016/0308481 A1 | 10/2016 | Lei et al. |
| 2016/0309622 A1 | 10/2016 | Lei et al. |
| 2016/0309623 A1 | 10/2016 | Lei et al. |
| 2016/0309624 A1 | 10/2016 | Lei et al. |
| 2017/0033704 A1 | 2/2017 | Lei et al. |
| 2017/0036563 A1 | 2/2017 | Degner et al. |
| 2017/0054347 A1 | 2/2017 | Lei et al. |
| 2017/0259672 A1 | 9/2017 | Lei et al. |
| 2017/0259691 A1 | 9/2017 | Lei et al. |
| 2017/0265337 A1 | 9/2017 | Lei et al. |

* cited by examiner

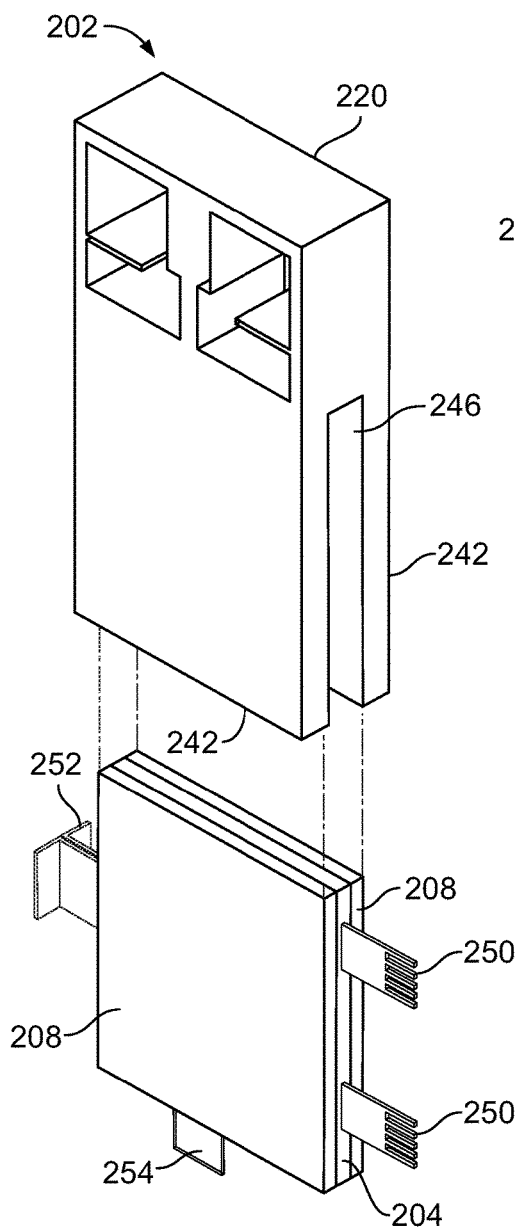
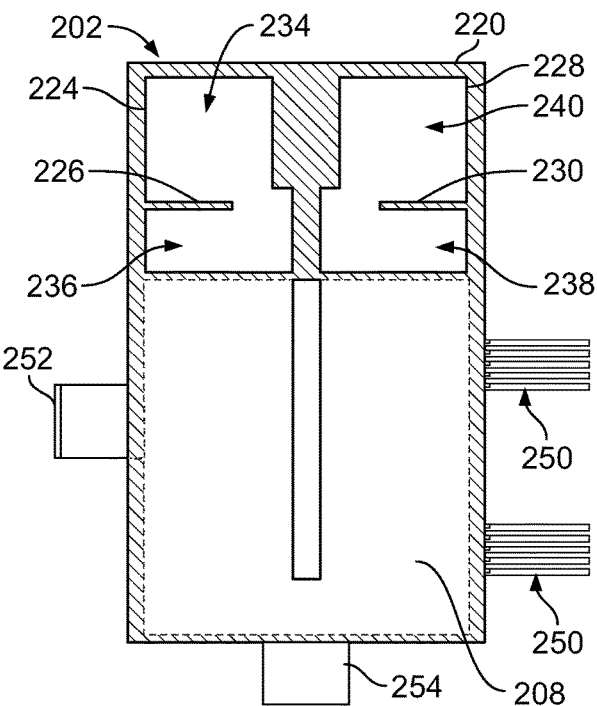
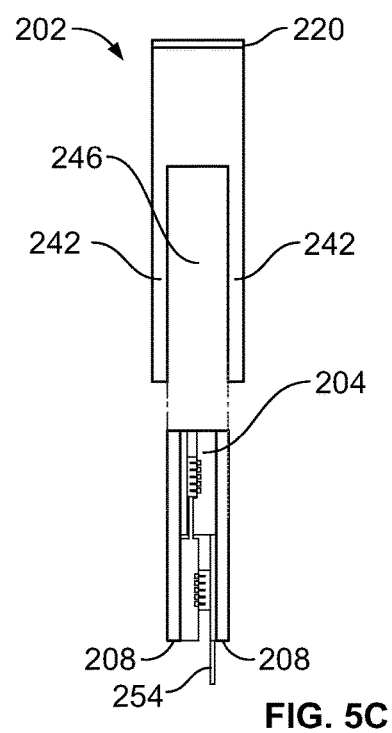
FIG. 5A
FIG. 5B
FIG. 5C

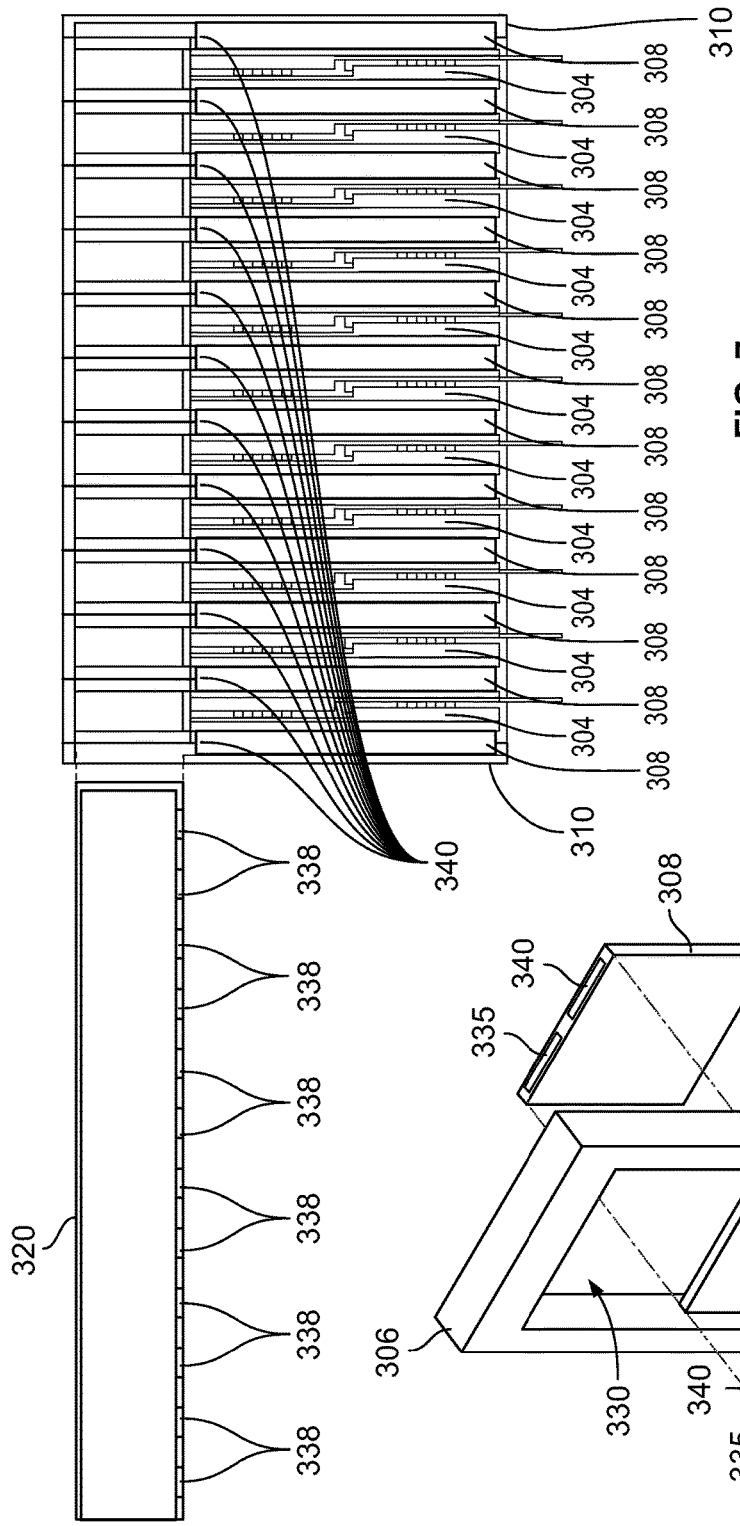
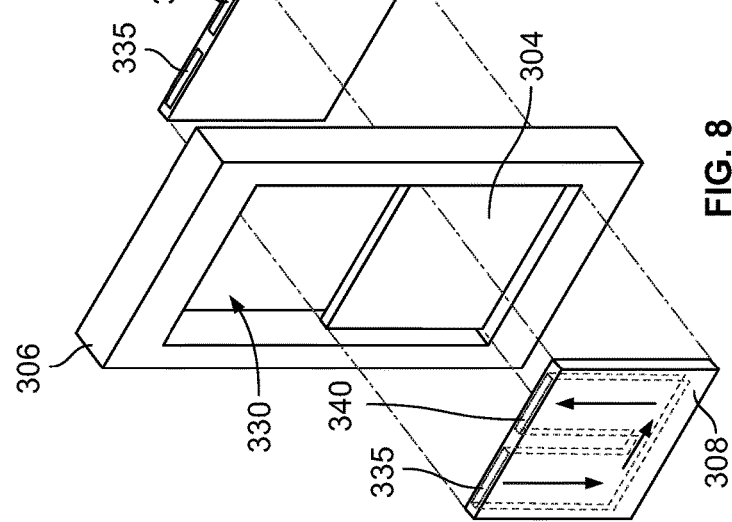

POWER MODULE ASSEMBLY AND MANIFOLD

REFERENCE TO RELATED APPLICATION

This application is a division of U.S. application Ser. No. 14/687,579 filed Apr. 15, 2015, the disclosure of which is hereby incorporated in its entirety by reference herein.

TECHNICAL FIELD

The present disclosure relates to power inverters and power module assemblies for automotive vehicles.

BACKGROUND

Electrified vehicles such as battery-electric vehicles (BEVs), plug-in hybrid-electric vehicles (PHEVs), mild hybrid-electric vehicles (MHEVs), or full hybrid-electric vehicles (FHEVs) contain an energy storage device, such as a high voltage (HV) battery system, to act as a propulsion source for the vehicle. The HV battery system may include components that assist in managing vehicle performance and operations.

SUMMARY

A vehicle power module assembly includes a stacked array of module frames, a manifold, and a pair of endplates. The stacked array of module frames each define a passthrough in registration with other of the passthroughs to define a manifold cavity, a power stage cavity, and a plurality of outlets open to the respective passthroughs and oriented relative to the power stage cavities to deliver coolant therebetween. The manifold is disposed within the manifold cavity and defines a manifold inlet open to an inlet chamber, manifold ports for alignment with the plurality of outlets, and a manifold outlet open to an outlet chamber. One of the endplates defines an inlet open to the manifold inlet and another one of the endplates defines an outlet open to the manifold outlet. The inlets, outlets, and ports are arranged with one another to provide a coolant path between the endplate inlet and endplate outlet. The assembly may include a power stage disposed in each power stage cavity. The power stages are arranged with one another such that a coolant channel is defined therebetween. Each module frame may be configured to retain a portion of a thermal plate on either side of the respective power stage cavity such that the thermal plates are in thermal communication with adjacent power stages. Each module frame may define multi-pass channels on either side of the respective power stage cavity. Each channel may be in fluid communication with the manifold inlet chamber and the manifold outlet chamber. Each module frame may further define a plurality of ledges offset from one another on opposite sides of the respective multi-pass channels. Each of the endplates may further define a recess sized to receive a portion of a thermal plate. Each of the module frames may further define a slot sized for a DC leadframe, an AC leadframe, or signal pins to extend therethrough.

A vehicle includes an electric machine, a traction battery, a power inverter, a power module assembly, a manifold, and a plurality of thermal plates. The traction battery is electrically connected to the electric machine. The power inverter is electrically connected between the battery and electric machine and has a plurality of power stages. The power module assembly supports the power inverter and has a plurality of module frames configured to support the power stages and each defines a passthrough such that the passthroughs define a manifold cavity when each of the plurality of module frames are stacked with one another. The manifold is disposed within the manifold cavity and defines an inlet chamber and an outlet chamber. Each of the plurality of thermal plates is supported by the frames and disposed between the power stages for thermal communication therewith and such that the thermal plates fluidly connect the inlet and outlet chambers. The manifold may further define an inlet open to the inlet chamber, an outlet open to the inlet chamber, and a step arranged with the inlet to influence a momentum of coolant traveling from the inlet to the outlet. The manifold may further define an inlet open to the outlet chamber, an outlet open to the outlet chamber, and a step arranged with the inlet to influence a momentum of coolant traveling from the inlet to the outlet. The thermal plate may be arranged with the manifold such that coolant travels along adjacent power stages between the outlet of the inlet chamber and the inlet of the outlet chamber. A pair of endplates may be disposed on either side of the frames and configured to retain the frames therebetween. One of the endplates may define an inlet open to the inlet chamber. A pair of endplates may be disposed on either side of the frames and configured to retain the frames therebetween. One of the endplates may define an outlet open to the outlet chamber.

BRIEF DESCRIPTION OF THE DRAWINGS

FIG. 5A is a perspective view of an example of a power module showing a power stage and thermal plates removed from a cavity of the power module.

FIG. 5B is a front view, in cross-section, of the power module of FIG. 5A.

FIG. 5C is a side view of the power module of FIG. 5A.

FIG. 7 is a side view of the portion of the power module assembly of FIG. 6 with portions of the power module removed to show internal components.

FIG. 8 is a perspective and partial-exploded view of a power module of the power module assembly of FIG. 6.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
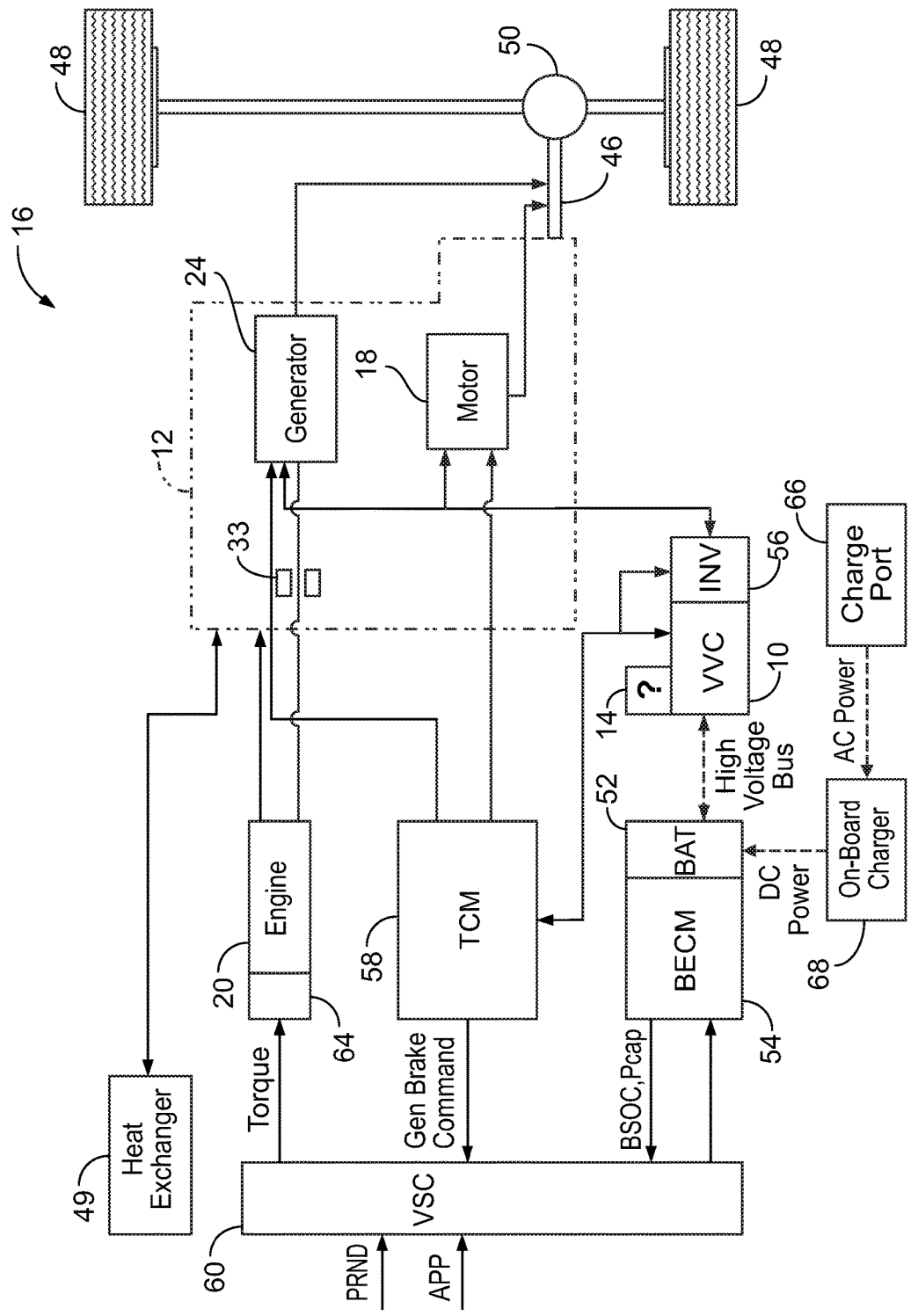
FIG. 1 is a schematic of an example hybrid vehicle.

An example of a PHEV is depicted in FIG. 1, referred to generally as a vehicle 16 herein. The vehicle 16 may include a transmission 12 and is an example of an electric vehicle propelled by an electric machine 18 with assistance from an internal combustion engine 20. The vehicle 16 may be connectable to an external power grid. The electric machine 18 may be an AC electric motor depicted as a motor 18 in FIG. 1. The electric machine 18 receives electrical power and provides torque for vehicle propulsion. The electric machine 18 may also function as a generator for converting mechanical power into electrical power through regenerative braking.

The transmission 12 may be a power-split configuration. The transmission 12 may include the first electric machine 18 and a second electric machine 24. The second electric machine 24 may be an AC electric motor depicted as a generator 24 in FIG. 1. Similar to the first electric machine 18, the second electric machine 24 may receive electrical power and provide output torque. The second electric machine 24 may also operate as a generator for converting mechanical power into electrical power and optimizing power flow through the transmission 12. In other embodiments, the transmission may not have a power-split configuration.

The transmission 12 may include a planetary gear unit (not shown) and may operate as a continuously variable transmission and without any fixed or step ratios. The transmission 12 may also include a one-way clutch (O.W.C.) and a generator brake 33. The O.W.C. may be coupled to an output shaft of the engine 20 to control a direction of rotation of the output shaft. The O.W.C. may prevent the transmission 12 from back-driving the engine 20. The generator brake 33 may be coupled to an output shaft of the second electric machine 24. The generator brake 33 may be activated to "brake" or prevent rotation of the output shaft of the second electric machine 24 and of the sun gear 28. Alternatively, the O.W.C. and the generator brake 33 may be replaced by implementing control strategies for the engine 20 and the second electric machine 24. The transmission 12 may be connected to a driveshaft 46. The driveshaft 46 may be coupled to a pair of drive wheels 48 through a differential 50. An output gear (not shown) of the transmission may assist in transferring torque between the transmission 12 and the drive wheels 48. The transmission 12 may also be in communication with a heat exchanger 49 or an automatic transmission fluid cooler (not shown) for cooling the transmission fluid.

The vehicle 16 includes an energy storage device, such as a traction battery 52 for storing electrical energy. The battery 52 may be a HV battery capable of outputting electrical power to operate the first electric machine 18 and the second electric machine 24 as further described below. The battery 52 may also receive electrical power from the first electric machine 18 and the second electric machine 24 when they are operating as generators. The battery 52 may be a battery pack made up of several battery modules (not shown), where each battery module contains a plurality of battery cells (not shown). Other embodiments of the vehicle 16 contemplate alternative types of energy storage devices, such as capacitors and fuel cells (not shown) that may supplement or replace the battery 52.

A high voltage bus may electrically connect the battery 52 to the first electric machine 18 and to the second electric machine 24. For example, the vehicle 16 may include a battery energy control module (BECM) 54 for controlling the battery 52. The BECM 54 may receive input indicative of certain vehicle conditions and battery conditions, such as battery temperature, voltage, and current. The BECM 54 may calculate and estimate parameters of the battery 52, such as a battery state of charge (BSOC) and a battery power capability (Pcap). The BECM 54 may provide output that is indicative of the BSOC and Pcap to other vehicle systems and controllers.

The vehicle 16 may include a DC-DC converter or variable voltage converter (VVC) 10 and an inverter 56. The VVC 10 and the inverter 56 may be electrically connected between the battery 52 and the first electric machine 18 and the second electric machine 24. The VVC 10 may "boost" or increase a voltage potential of electrical power provided by the battery 52. The VVC 10 may also "buck" or decrease voltage potential of the electrical power provided to the battery 52. The inverter 56 may invert DC power supplied by the battery 52 via the VVC 10 to AC power for operating each of the electric machines 18 and 24. The inverter 56 may also rectify AC power provided by each of the electric machines 18 and 24 to DC for charging the battery 52. In other examples, the transmission 12 may operate with multiple inverters, such as one invertor associated with each of the electric machine 18 and 24. The VVC 10 includes an inductor assembly 14 (further described in relation to FIG. 2).

The transmission 12 is shown in communication with a transmission control module (TCM) 58 for controlling the electric machines 18 and 24, the VVC 10, and the inverter 56. The TCM 58 may be configured to monitor conditions of each of the electric machines 18 and 24 such as position, speed, and power consumption. The TCM 58 may also monitor electrical parameters (e.g., voltage and current) at various locations within the VVC 10 and the inverter 56. The TCM 58 provides output signals corresponding to this information for other vehicle systems to utilize.

The vehicle 16 may include a vehicle system controller (VSC) 60 that communicates with other vehicle systems and controllers for coordinating operations thereof. Although shown as a single controller, it is contemplated that the VSC 60 may include multiple controllers to control multiple vehicle systems and components according to an overall vehicle control logic or software.

The vehicle controllers, such as the VSC 60 and the TCM 58, may include various configurations of microprocessors, ASICs, ICs, memory (e.g., FLASH, ROM, RAM, EPROM and/or EEPROM), and software code to cooperate with one another to perform vehicle operations. The controllers may also include predetermined data, or "look up tables," which are accessible from the memory and may be based on calculations and test data. This predetermined data may be utilized by the controllers to facilitate control of the vehicle operations. The VSC 60 may communicate with other vehicle systems and controllers (e.g., the BECM 54 and the TCM 58) over one or more wired or wireless connections using bus protocols such as CAN and LIN. The VSC 60 may receive input (PRND) that represents a current position of the transmission 12 (e.g., park, reverse, neutral or drive). The VSC 60 may also receive input (APP) that represents an accelerator pedal position. The VSC 60 may provide outputs representative of a desired wheel torque, desired engine speed, and a generator brake command to the TCM 58; and contactor control to the BECM 54.

The vehicle 16 may include an engine control module (ECM) 64 for controlling the engine 20. The VSC 60 provides output, such as desired engine torque, to the ECM 64 that may be based on a number of input signals including APP and may correspond to a driver's request for vehicle propulsion.

The battery 52 may periodically receive AC energy from an external power supply or grid via a charge port 66. The vehicle 16 may also include an on-board charger 68 which receives the AC energy from the charge port 66. The charger 68 may include AC/DC conversion capability to convert the received AC energy into DC energy suitable for charging the battery 52 during a recharge operation. Although illustrated and described in the context of a PHEV, it is contemplated that the inverter 56 may be implemented with other types of electrified vehicles, such as a FHEV or a BEV.

Figure 2:
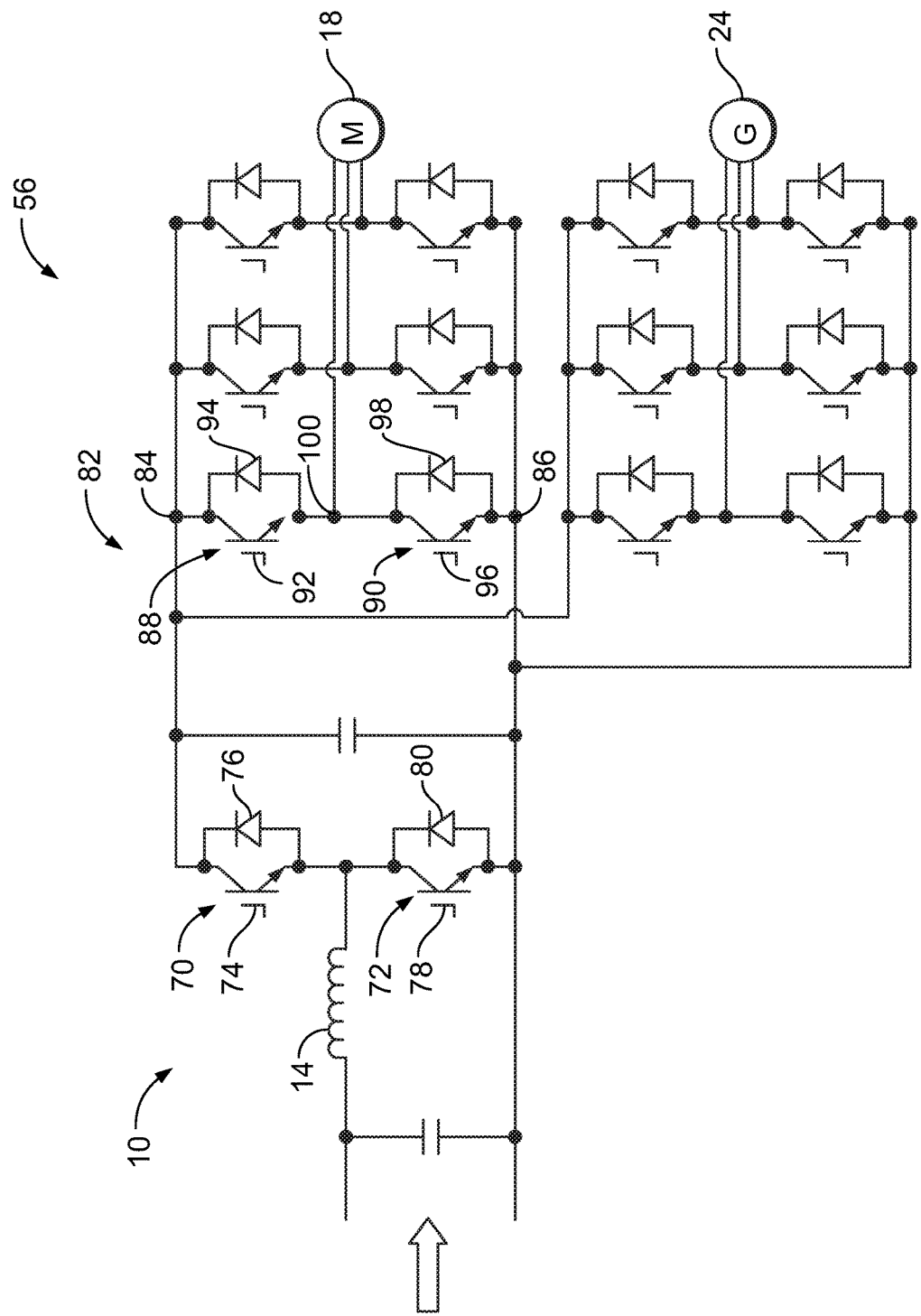
FIG. 2 is an electrical schematic of a variable voltage converter and a power inverter.

Referring to FIG. 2, an example of an electrical schematic of the VVC 10 and the inverter 56 is shown. The VVC 10 may include a first switching unit 70 and a second switching unit 72 for boosting the input voltage (V_bat) to provide output voltage (V_dc). The first switching unit 70 is shown with a first transistor 74 connected in parallel to a first diode 76 and with their polarities switched (referred to as anti-parallel herein). The second switching unit 72 is shown with a second transistor 78 connected anti-parallel to a second diode 80. Each of the transistors 74 and 78 may be a type of controllable switch (e.g., an insulated gate bipolar transistor (IGBT) or field-effect transistor (FET)). Additionally, each of the transistors 74 and 78 may be individually controlled by the TCM 58. The inductor assembly 14 is depicted as an input inductor that is connected in series between the battery 52 and the switching units 70 and 72. The inductor assembly 14 may generate magnetic flux when a current is supplied. When the current flowing through the inductor assembly 14 changes, a time-varying magnetic field is created and a voltage is induced. Other embodiments of the VVC 10 may include alternative circuit configurations (e.g., more than two switches).

The inverter 56 may include a plurality of half-bridges 82 stacked in an assembly. Each of the half-bridges 82 may be packaged as a power stage. In the illustrated example, the inverter 56 includes six half-bridges (though FIG. 2 labels only one complete half-bridge 82), three for the motor 18 and three for the generator 24. Each of the half bridges 82 may include a positive DC lead 84 that is coupled to a positive DC node from the battery 52 and a negative DC lead 86 that is coupled to a negative DC node from the battery 52. Each of the half bridges 82 may also include a first switching unit 88 and a second switching unit 90. The first switching unit 88 includes a first transistor 92 connected in parallel to a first diode 94. The second switching unit 90 includes a second transistor 96 connected in parallel to a second diode 98. The first transistor 92 and the second transistors 96 may be IGBTs or FETs. The first switching unit 88 and the second switching unit 90 of each of the half-bridges 82 converts the DC power of the battery 52 into a single-phase AC output at the AC lead 100. Each of the AC leads 100 is electrically connected to the motor 18 or generator 24. In this example, three of the AC leads 100 are electrically connected to the motor 18 and the other three AC leads 100 are electrically connected to the generator 24.

Components of VVCs and inverters may be heated and/or cooled using a liquid thermal management system, an air thermal management system, or other method as known in the art. In one example of a liquid thermal management system, a thermal plate may be in thermal communication with the components of the VVC or inverter. A system, such as a pressurized system, may control a flow of coolant through the thermal plates to assist in dissipating heat from the components, such as heat generated during a voltage conversion. The thermal management system may be arranged with and/or supported by a power module assembly such that the thermal plates are in thermal communication with the components to facilitate cooling thereof by the coolant.

Figure 3:
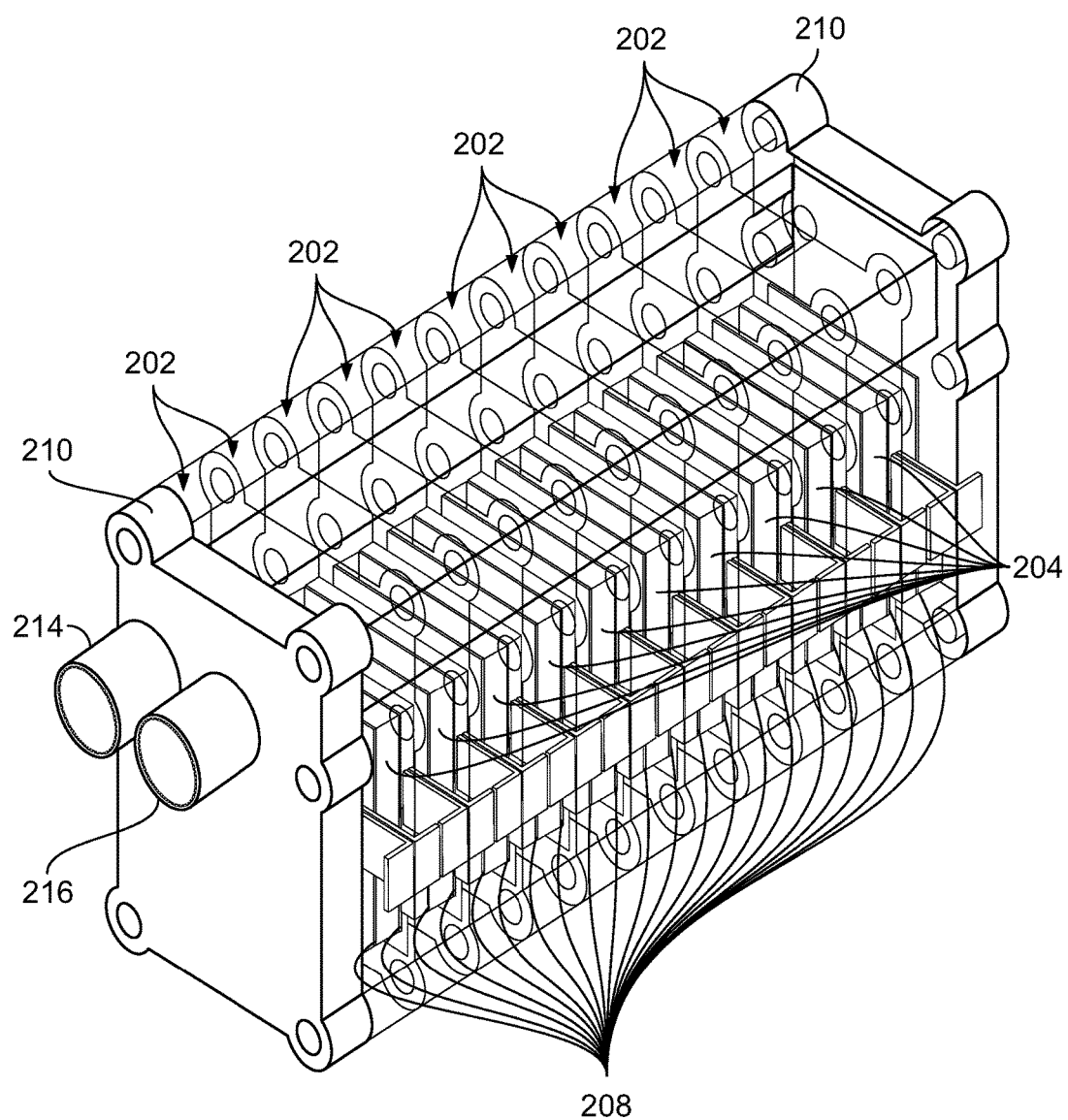
FIG. 3 is a perspective view of an example of a portion of a power module assembly.
Figure 4:
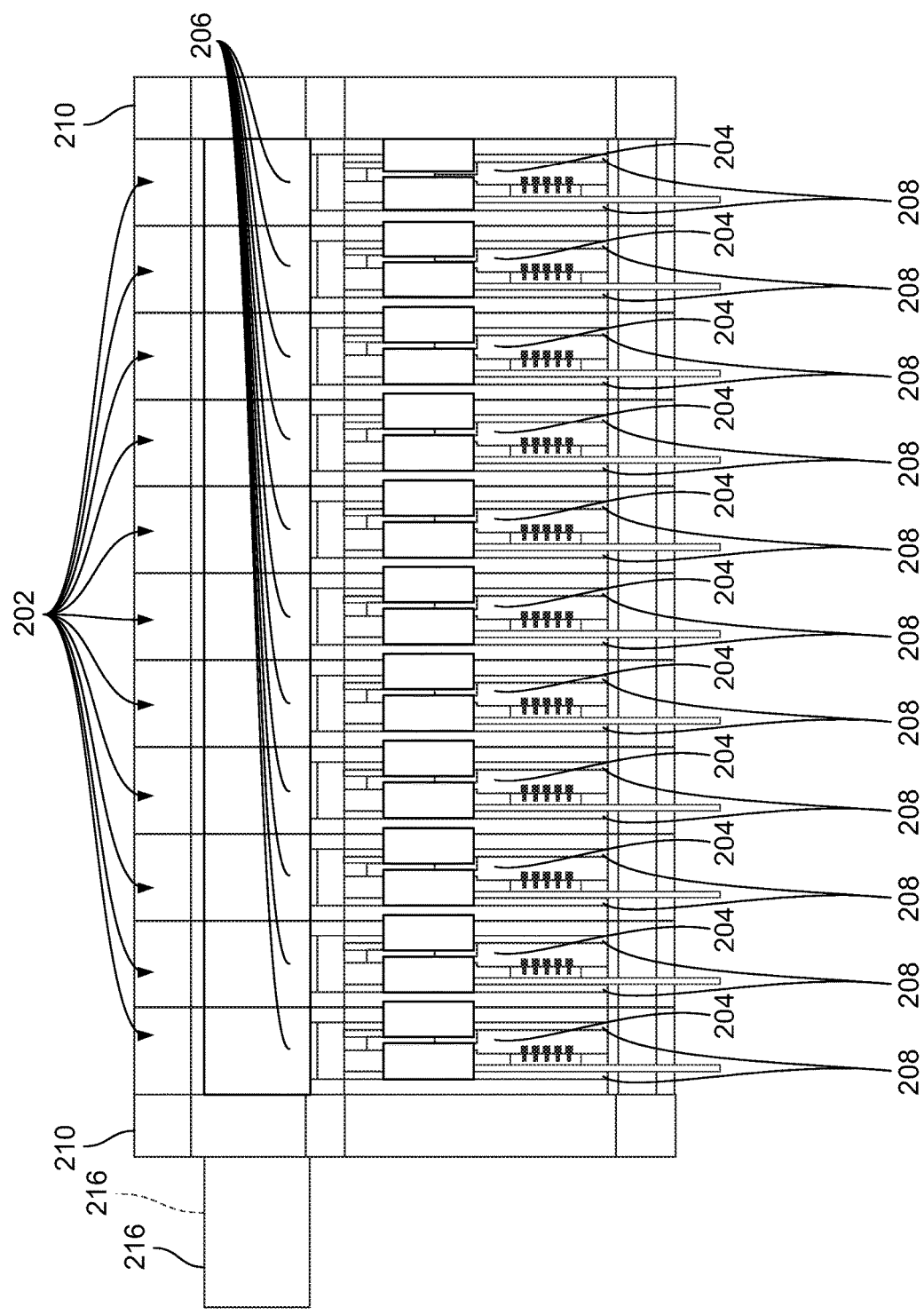
FIG. 4 is a side view of the portion of the power module assembly of FIG. 3.

FIGS. 3 and 4 show an example of a portion of a power module assembly for use with an electrified vehicle, referred to generally as a power module assembly 200 herein. The power module assembly 200 may include a plurality of power modules stacked in an array, each power module referred to generally as a power module 202 herein. Each power module 202 may include a power stage 204 retained by a frame 206. Each power stage 204 may include semiconductors, a direct current (DC) terminal, and an alternating (AC) terminal. The power stage 204 may be adjacent to one or more thermal plates 208. The thermal plates 208 may be in thermal communication with adjacent power stages 204. The frame 206 may orient the thermal plates 208 in a location proximate to the power stages 204 to provide a flow path for coolant to assist in managing thermal conditions of the power stages 204.

A pair of endplates 210 may be disposed on opposite ends of the array of power modules 202. The endplates 210 may be secured to an adjacent frame of the frames 206 and may assist in retaining the power modules 202 therebetween. One of the endplates 210 may include an endplate inlet 214. One of the endplates 210 may include an endplate outlet 216. It is contemplated that various configurations are available for locations of the endplate inlet 214 and the endplate outlet 216. For example, one of the endplates 210 may include both the endplate inlet 214 and the endplate outlet 216. As another example, the endplate inlet 214 and the endplate outlet 216 may be on different endplates 210. The endplate inlet 214 and the endplate outlet 216 operate with a thermal management system of the power module assembly 200 to assist in delivering and removing coolant to and from power modules 202. Each of the endplates 210 may define a recess sized to receive a portion of one of the thermal plates 208.

Referring now additionally to FIGS. 5A through 5C, an example of a configuration of one of the power modules 202 is shown. The power modules 202 include a frame 220. The frame 220 may define a first passthrough 224, a first step 226, a second passthrough 228, and a second step 230. When the power modules 202 are stacked together, the first passthroughs 224 may be in at least partial registration with one another and the second passthroughs 228 may be in at least partial registration with one another. Further, the first steps 226 may be aligned with one another to at least partially define a first chamber 234 and a second chamber 236 and the second steps 230 may be aligned with one another to at least partially define a third chamber 238 and a fourth chamber 240. The chambers and steps may be arranged with one another to define an integrated manifold to assist in delivering and removing coolant to and from the thermal plates 208.

For example, the chambers may be open to an inlet and outlet, such as the endplate inlet 214 and the endplate outlet 216. In this example, the first chamber 234 may be open to the endplate inlet 214 to receive coolant therefrom. The aligned steps 226 may be arranged with the endplate inlet 214 such that the steps 226 influence a momentum of coolant flowing between the first chamber 234 and the second chamber 236. For example, coolant traveling between the first chamber 234 and the second chamber 236 may contact the aligned first steps 226. Similarly, coolant traveling between the third chamber 238 and the fourth chamber 240 may contact the aligned second steps 230. This contact may disrupt characteristics of the coolant flow, such as a velocity, to assist in promoting a more uniform flow of coolant into the second chamber 236 and subsequently into the thermal plates 208 to assist in managing thermal conditions of the power stages 204 as now described.

Each of the frames 220 may include a pair of extension members 242 extending from an upper portion of the frame 220. The extension members 242 may define a power stage cavity 246 therebetween. The power stage cavity 246 may be sized to receive one of the power stages 204 and also to provide clearance for components thereof to extend from the power stages 204. For example, each power stage 204 may include two sets of signal pins 250, a DC power terminal 252 (positive and negative terminals), and an AC power terminal 254. The signal pins 250 may be connected to a gate drive board (not shown). The DC power terminal 252 may be connected to a capacitor module (not shown). The AC power terminal 254 may be connected to an electric machine (not shown). Heat may be generated during operation of the components of the power stages 204 which may negatively affect performance and operational efficiency. The thermal plates 208 may assist in dissipating the generated heat to promote consistent performance and output of the power stages 204 and the components thereof.

For example, the extension members 242 may each define cavities or cutouts sized to receive the thermal plates 208 or at least a portion thereof. The thermal plates 208 may be in thermal communication with the adjacent power stage 204 when disposed within their respective cavities. The thermal plates 208 may also be configured for fluid communication with the second chamber 236 and the third chamber 238. The arrangement of the chambers and thermal plates 208 provides a flow path for coolant to travel proximate the power stages 204 to assist in managing thermal conditions thereof. In another example, the extension members 242 may define features on the surfaces of the cavities of the extension members 242 to assist in directing coolant flowing therethrough such that a thermal plate is defined by the frame 220.

Figure 6:
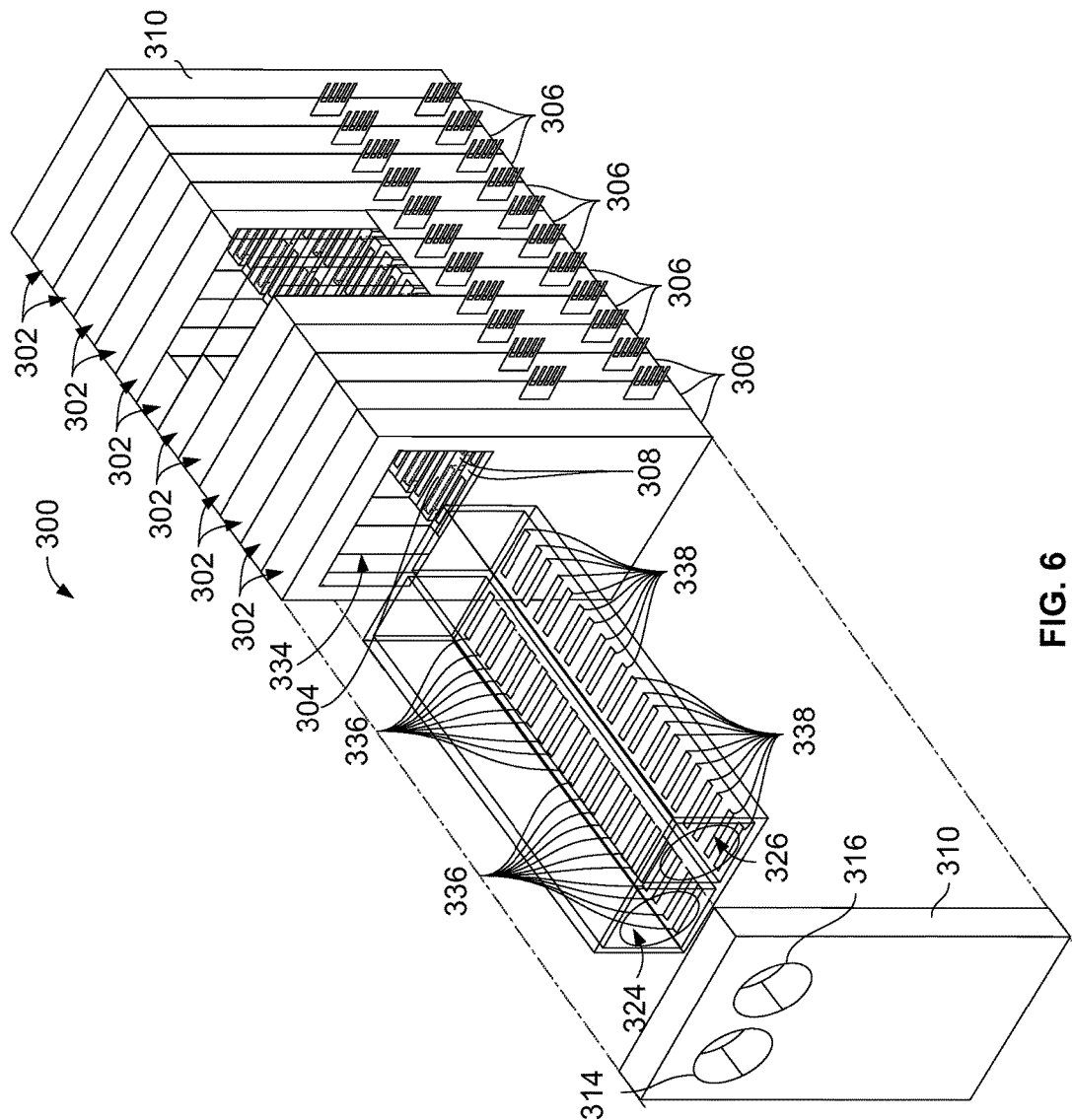
FIG. 6 is a perspective and partial-exploded view of an example of a portion of a power module assembly.

FIGS. 6 and 7 show another example of a portion of a power module assembly, referred to generally as a power module assembly 300 herein. The power module assembly 300 may include a plurality of power modules stacked in an array, each power module referred to generally as a power module 302 herein. Each power module 302 may include a power stage 304 retained by a frame 306. Each power stage 304 may include semiconductors, a direct current (DC) terminal, and an alternating (AC) terminal. The power stage 304 may be adjacent to one or more thermal plates 308. The thermal plates 308 may be in thermal communication with adjacent power stages 304. The frame 306 may orient the thermal plates 308 in a location proximate to the power stages 304 to provide a flow path for coolant to assist in managing thermal conditions of the power stages 304.

A pair of endplates 310 may be disposed on opposite ends of the array of power modules 302. The endplates 310 may be secured to an adjacent frame of the frames 306 and may assist in retaining the power modules 302 therebetween. One of the endplates 310 may include an endplate inlet 314. One of the endplates 310 may include an endplate outlet 316. It is contemplated that various configurations are available for locations of the endplate inlet 314 and the endplate outlet 316. For example, one of the endplates 310 may include both the endplate inlet 314 and the endplate outlet 316. As another example, the endplate inlet 314 and the endplate outlet 316 may be on different endplates 310. The endplate inlet 314 and the endplate outlet 316 operate with a thermal management system of the power module assembly 300 to assist in delivering and removing coolant to and from the power modules 302.

For example, the endplate inlet 314 may open to a manifold 320. The manifold 320 may include an inlet chamber 324 and an outlet chamber 326. The endplate outlet 316 may be open to the outlet chamber 326. The manifold 320 may be sized for disposition within a cavity defined by the frames 306 of the power modules 302. For example and as further shown in FIG. 8, each frame 306 may define a passthrough 330. When the power modules 302 are stacked together, the passthroughs 330 may be in at least partial registration with one another to define a manifold cavity 334 (shown in FIG. 6) to receive the manifold 320 to assist in delivering coolant to the thermal plates 308. Directional arrows in FIG. 8 show one example of a pattern of coolant flow within the thermal plates 308.

For example, the manifold 320 may define a plurality of manifold outlets 336 in the inlet chamber 324 and a plurality of manifold inlets 338 in the outlet chamber 326. The manifold outlets 336 may open to respective thermal plate inlets 335 of the thermal plates 308 or coolant channels between the power stages 304 such that coolant may flow therethrough. The thermal plates 308 may define thermal plate outlets 340 to assist in delivering coolant to the outlet chamber 326 after traveling through the thermal plate 308.

Figure 9:
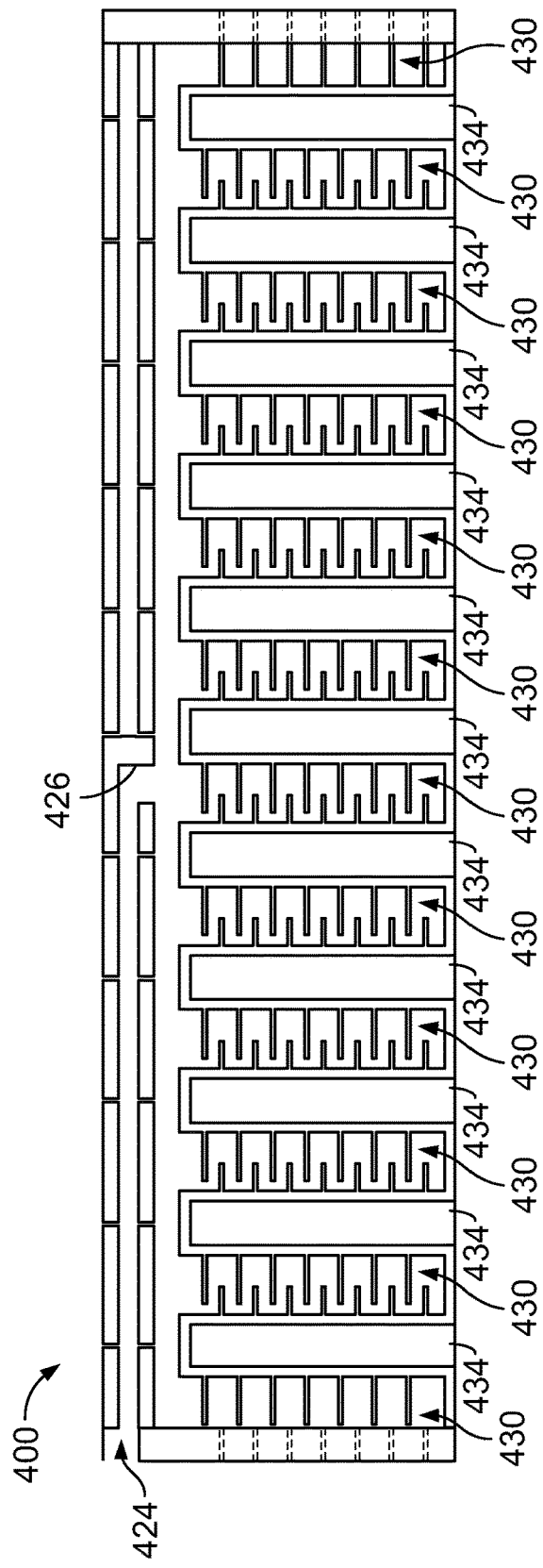
FIG. 9 is a side view, in cross-section, of another example of a configuration for a portion of a power module assembly.

FIG. 9 shows, in cross-section, another example of a configuration for a portion of a power module assembly, referred to generally as a power module assembly 400. An inlet chamber 424 of a manifold may define an opening 426 in fluid communication with channels 430 defined between power stages 434 such that coolant may enter the channels 430. The inlet chamber 424 may extend along only a portion of the length of the power module assembly 400 such that the opening 426 may be disposed at a substantially central location relative to the power module assembly 400. An outlet chamber (not shown) of the manifold may receive the coolant after flowing through the channels 430. In this example, the channels 430 may provide a flow path similar to that of the thermal plates 308 described above (FIG. 9 shows only portions of the channels 430 though it is to be understood that the channels 430 may be configured to provide a coolant path similar to that of the thermals plates 308). Additionally, the channels 430 may include features, such as extrusions or steps, to direct a flow of coolant within the channels 430 to promote thermal communication with adjacent power stages 434. For example, the channels 430 may include ledges offset from one another on opposite sides of the respective channel 430 and spaced apart along a length of the channel 430. Each of the channels 430 may be a multi-pass channel.

Figure 10:
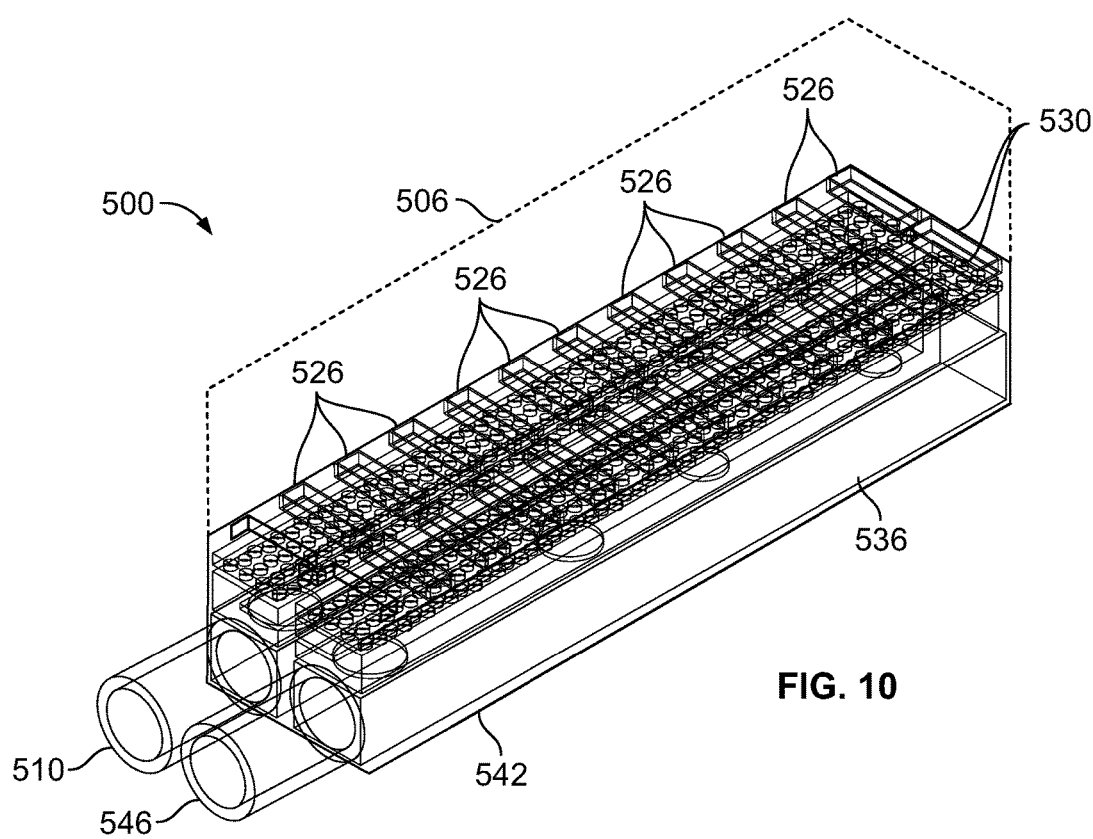
FIG. 10 is a perspective view of an example of a portion of a power module assembly.
Figure 11:
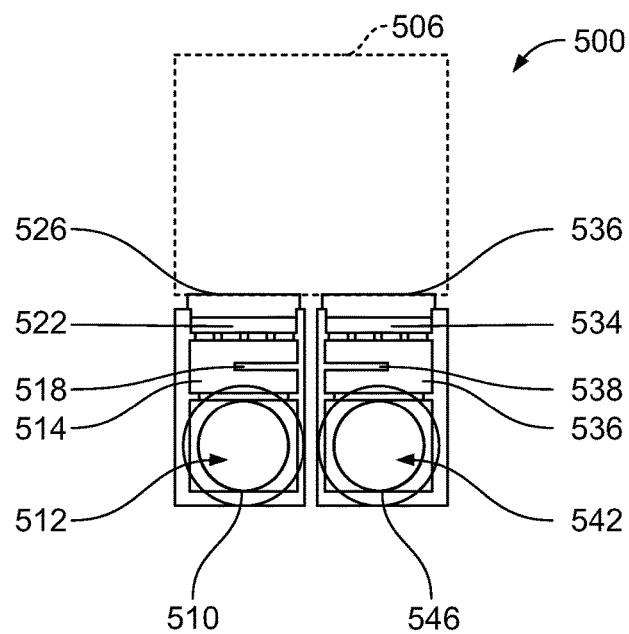
FIG. 11 is side view, in partial cross-section, of the portion of the power module assembly of FIG. 11.

FIGS. 10 and 11 show another example of a configuration for a portion of a power module assembly, referred to generally as a power module assembly 500 herein. In this example, a manifold is show below a power module stack comprising a plurality of power module assemblies 506 (shown in phantom to illustrate components thereunder). The manifold may define or include an inlet 510 in fluid communication with a first chamber 512 and a second chamber 514. A step first 518 may be disposed within the second chamber 514 and at least partially divide the second chamber 514. A first screen 522 may be located upstream of the second chamber 514. Each of a plurality of first ports 526 may be upstream of the first screen 522 and open to a channel (not shown) of the power module assembly 506. The channel may be configured to direct coolant flow adjacent a power stage (not shown) of the power module assembly 506. Each of a plurality of second ports 530 may be downstream of the respective channels. A second screen 534 may be downstream of the respective second port 530 and open to a third chamber 536. A second step 538 may be disposed within the third chamber 536 and may at least partially divide the third chamber 536. The third chamber 536 may be in fluid communication with a fourth chamber 542 which may open to an outlet 546.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   a power inverter electrically connected between a traction battery and an electric machine and having power stages;
   a power module assembly supporting the inverter and having frames to support the stages and each defining a passthrough forming a manifold cavity;
   a manifold defining inlet and outlet chambers; and
   thermal plates supported by the frames between the stages to fluidly connect the inlet and outlet chambers.

2. The vehicle of claim 1, further comprising a pair of endplates disposed on either side of the frames to retain the frames therebetween, wherein one of the endplates defines an inlet open to the inlet chamber.

3. The vehicle of claim 1, further comprising a pair of endplates disposed on either side of the frames to retain the frames therebetween, wherein one of the endplates defines an outlet open to the outlet chamber.

* * * * *